United States Patent
Schmit (10) Patent No.: US 11,006,513 B1
(45) Date of Patent: May 11, 2021

(54) ELECTRONIC ASSEMBLY HAVING SECTIONAL THERMAL MANAGEMENT

(71) Applicant: Deere & Company, Moline, IL (US)

(72) Inventor: Christopher J. Schmit, Fargo, ND (US)

(73) Assignee: DEERE & COMPANY, Moline, IL (US)

( * ) Notice: Subject to any disclaimer, the term of this patent is extended or adjusted under 35 U.S.C. 154(b) by 0 days.

(21) Appl. No.: 16/706,076

(22) Filed: Dec. 6, 2019

Related U.S. Application Data (60) Provisional application No. 62/927,993, filed on Oct. 30, 2019.

(51) Int. Cl.
| | |
|---|---|
| *H05K 1/02* | (2006.01) |
| *H05K 7/20* | (2006.01) |
| *H01L 23/473* | (2006.01) |
| *H05K 1/18* | (2006.01) |

(52) U.S. Cl.
CPC ......... *H05K 1/0207* (2013.01); *H01L 23/473* (2013.01); *H05K 1/181* (2013.01); *H05K 7/205* (2013.01); *H05K 7/209* (2013.01); *H05K 7/20409* (2013.01); *H05K 7/20927* (2013.01); *H05K 2201/062* (2013.01); *H05K 2201/064* (2013.01); *H05K 2201/10015* (2013.01); *H05K 2201/10053* (2013.01)

(58) Field of Classification Search
CPC ..... H05K 7/2089–209; H05K 7/20409; H05K 7/205; H05K 7/20518; H05K 1/0203–0204; H05K 1/0207
See application file for complete search history.

(56) References Cited

U.S. PATENT DOCUMENTS

| | | | |
|---|---|---|---|
| 4,509,095 A * | 4/1985 | Boros | H05K 1/0201 361/721 |
| 6,212,086 B1 | 4/2001 | Dinh | |
| 6,762,942 B1 | 7/2004 | Smith | |
| 7,903,417 B2 * | 3/2011 | Stahlhut | H05K 3/3452 361/713 |
| 8,851,356 B1 | 10/2014 | Holec et al. | |
| 9,155,231 B2 * | 10/2015 | Masuda | G06F 1/20 |
| 9,232,640 B2 * | 1/2016 | Zhang | H05K 7/02 |
| 9,348,377 B2 * | 5/2016 | Dean | G06F 1/20 |
| 2002/0123259 A1 | 9/2002 | Yatskov et al. | |
| 2003/0079341 A1 | 5/2003 | Miyake et al. | |

FOREIGN PATENT DOCUMENTS

KR  20050085817 A * 8/2005 ........... H04N 5/2251

* cited by examiner

*Primary Examiner* — Zachary Pape (57) ABSTRACT

The first board section comprises a switching module with heat-generating semiconductor switches associated with a first operational temperature range. The first board section has a first conductive layer of a first thickness. The second board section comprises a plurality of capacitors mounted on a second circuit board. The second board section has conductive traces for interconnecting the capacitors as a network. The capacitors are associated with a second operational temperature range that is lower than the first operational temperature range. A thermal isolation intermediary forms a barrier between, or adjoining, the first board section and the second board section, where the first board section and the second board section are spaced part from each other by the thermal isolation intermediary.

18 Claims, 9 Drawing Sheets

ELECTRONIC ASSEMBLY HAVING SECTIONAL THERMAL MANAGEMENT

RELATED APPLICATIONS

This document (including the drawings) claims priority and the benefit of the filing date based on U.S. provisional application No. 62/927,993, filed Oct. 30, 2019 under 35 U.S.C. § 119 (e), where the provisional application is hereby incorporated by reference herein.

GOVERNMENT LICENSE RIGHTS

This invention was made with U.S. government support under contract or award No. DE-EE0006521 awarded by the Department of Energy. The government has certain rights in the invention.

DISCLOSURE

This disclosure relates to an electronic assembly having sectional thermal management.

BACKGROUND

Different electronic components may have different maximum temperature ratings. Different electronic components may be incompatible where the maximum temperature ratings of some components on a circuit board may be exceeded. Therefore, there is a need for an electronic assembly having sectional thermal management to improve thermal compatibility among different components.

SUMMARY

In accordance with one embodiment, an electronic assembly comprises a circuit board with a first board section and a second board section. The first board section comprises a switching module with heat-generating semiconductor switches associated with a first operational temperature range. The first board section has a first conductive layer of a first thickness. The second board section comprises a plurality of capacitors mounted on a second circuit board. The second board section has having a first metallic layer that comprises conductive traces for interconnecting the capacitors as a network. The capacitors are associated with a second operational temperature range that is lower than the first operational temperature range. A thermal isolation intermediary forms a barrier between, or adjoining, the first board section and the second board section, where the first board section and the second board section are spaced part from each other by the thermal isolation intermediary.

DETAILED DESCRIPTION

As used in this document, "configured to, adapted to, or arranged to" mean that the data processor, converter or controller is programmed with suitable software instructions, software modules, executable code, data libraries, and/or requisite data to execute any referenced functions, mathematical operations, logical operations, calculations, determinations, processes, methods, algorithms, subroutines, or programs that are associated with one or more blocks set forth in any other drawing in this disclosure. Alternately, separately from or cumulatively with the above definition, "configured to, adapted to, or arranged to" can mean that the converter comprises one or more components described herein as software modules, equivalent electronic hardware modules, or both to execute any referenced functions, logic operations, mathematical operations, calculations, determinations, processes, methods, algorithms, subroutine.

In accordance with one embodiment, an electronic assembly 11 comprises a circuit board 10 with a first board section 12 and a second board section 14. The first board section 12 comprises a switching module 16 with heat-generating semiconductor switches associated with a first operational temperature range. The first board section 12 has a first conductive layer 18 of a first thickness 22 and a second conductive layer 19 of a second thickness 122, where in some configurations the first thickness 22 (e.g., approximately 2 millimeters) substantially equals the second thickness 122. In one embodiment, the first conductive layer 18 and a second conductive layer 19 are spaced apart from each other or separated from each other by an intermediate dielectric layer 23 to electrically isolate the first conductive layer 18 and the second conductive layer 19 from each other.

The second board section 14 comprises a plurality of capacitors 20 mounted on a second circuit board or flexible circuit board. The second board section 14 has a first metallic layer 35 and a second metallic layer 39 comprising conductive traces for interconnecting the capacitors 20 as a network. The capacitors 20 are associated with a second operational temperature range that is lower than the first operational temperature range. In one embodiment, the first metallic layer 35 and a second metallic layer 39 are separated from each other by the intermediate dielectric layer 37 to electrically isolate the first metallic layer 35 and the second metallic layer 39 from each other.

A thermal isolation intermediary 26 forms a barrier between, or adjoining, the first board section 12 and the second board section 14, where the first board section 12 and the second board section 14 are spaced part from each other by the thermal isolation intermediary 26.

In one embodiment, the thermal isolation intermediary 26 comprise a flexible thermal isolation valley. The thermal isolation intermediary 26 may have a thin conductive layer, that is thinner than the first thickness 22, to prevent heat transfer (e.g., increase thermal resistance) from the first board section 12 and their heat-generating semiconductor switches to the second board section 14. In one configuration, the thin conductive layer of a primary thickness 24 (or referred to as the second thickness) is welded or soldered to the first conductive layer 18 at an overlapping interface 28 or at, adjoining, proximate, or near an area associated with the overlapping interface 28.

In one embodiment, the thermal isolation intermediary 26 comprises a flexible thermal isolation direct current bus comprising a primary conductive layer 27 and a secondary conductive layer 33 separated by the intermediate dielectric layer 29. Exterior dielectric layers (123, 223) overly the primary conductive layer 27 and the secondary conductive layer 33. Further, the thermal isolation intermediary 26 can be folded to increase the thermal resistance and thermal isolation between the first board section 12 and the second board section 14. The thermal isolation intermediary 26 may be fixed or retained in its folded position by thermally conductive dielectric filler or dielectric potting compound (e.g., injected into or placed within air gap volume 55 in the housing) that encapsulates the thermal isolation intermediary 26 and conducts thermal energy from the thermal isolation intermediary to an upper housing portion 32, a lower housing portion, or both.

In one configuration, the second board section 14 comprises a continuous extension of the thermal isolation intermediary 26. For example, in the thermal isolation intermediary 26, the first metallic layer 35 comprises a continuous extension of a primary conductive layer 27 and the second metallic layer 39 comprises a continuous extension of a secondary conductive layer 33.

In one embodiment, a first recess 81 (in FIG. 7E) in the first conductive layer 18 receives an end of the primary conductive layer 27 that is bonded, brazed, welded or soldered to form an electrical and mechanical connection between the first conductive layer 18 and the primary conductive layer 27, where the first recess 81 of the first conductive layer 18 is bonded, brazed, welded or soldered to the end or end portion of the primary conductive layer 27. Similarly, a second recess 83 in the second conductive layer 19 for receiving an end of the secondary conductive layer 33 that is bonded, brazed, welded or soldered to form an electrical and mechanical connection between the second conductive layer 19 and the secondary conductive layer 33, where the second recess 83 of the second conductive layer 19 is bonded, brazed, welded or soldered to the end or end portion of the secondary conductive layer 33. Although other electrical connections are possible, in some configurations, the first conductive layer 18 is electrically and mechanically connected to the primary conductive layer 27 in a first array of spot welds or fusion points (e.g., at oval regions 88); wherein the second conductive layer 19 is electrically and mechanically connected to the secondary conductive layer 33 in a second array of spot welds or fusion points (e.g., at oval regions 88).

Figure 7A:
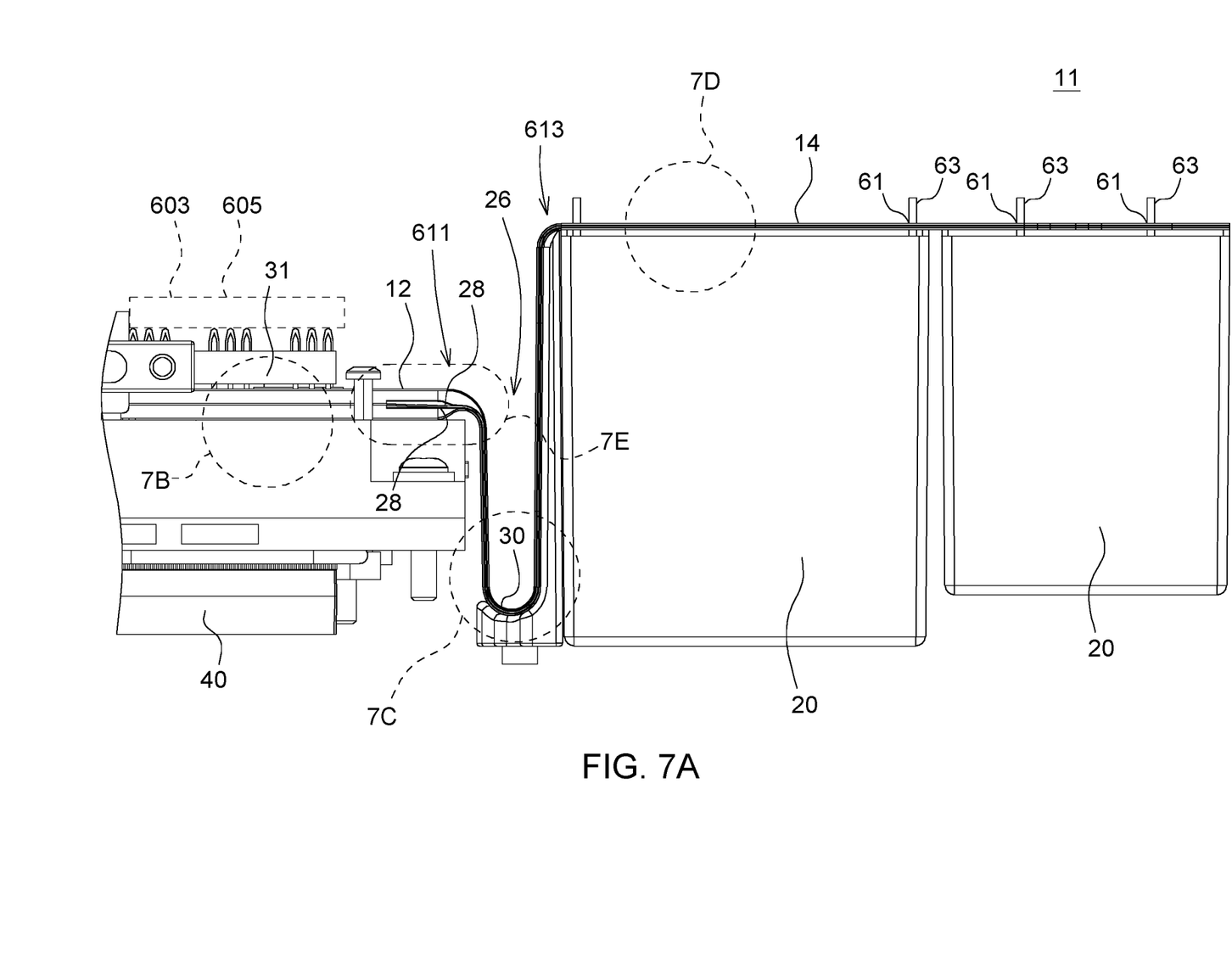
FIG. 7A is a side view of the one embodiment of the electronic assembly with the housing removed.

Further, alone or together with the thin conductive layer, the thermal isolation intermediary 26 comprises a flexible thermal isolation valley that has a lower portion 30 (in FIG. 7A) that is lower than the first board section 12 and the second board section 14 to prevent or reduce heat transfer from the first board section 12 to the second board section 14.

As illustrated, the primary conductive layer 27 and the secondary conductive layer 33 separated by an intermediate dielectric layer 37 may form a direct current bus that supports communication of electrical energy between switching module 16 and the capacitors 20 to filter current ripple in a direct current (DC) bus that supplies the switching module 16 with electrical energy.

In an alternate embodiment, the thermal isolation intermediary 26 ma comprise additional or supplemental embedded conductors or conductive traces to communicate electrical energy between switching module 16 and the capacitors 20 to filter current ripple in a direct current (DC) bus that supplies the switching module 16 with electrical energy.

In an alternate embodiment, the thermal isolation intermediary 26 has embedded conductors or conductive traces to communicate data messages or control signals between the first board section 12 and the second board section 14.

Although other arrangements are possible, in one illustrative arrangement the thermal isolation intermediary 26 comprises a flexible circuit board 10 composed of a polyimide dielectric layer and at least one copper layer overlying the polyimide dielectric layer.

In one configuration, the first board section 12 has a first operational temperature range with an upper temperature limit of approximately 125 degrees Celsius. For example, the semiconductors or switching module 16 associated with the first board section 12 may have a maximum temperature rating of the upper limit or approximately 125 degrees Celsius. Further, the maximum temperature rating, or operation temperature range of the semiconductor switches may depend upon the semiconductor materials, the packaging of the semiconductor switches, and the construction of the semiconductor materials in conjunction with the packaging and terminals. In some configurations, where the semiconductor material is composed of silicon carbide the maximum temperature rating may equal or exceed 125 degrees Celsius.

In one embodiment, the second board section 14 has second operational temperature range has an upper temperature limit of approximately 85 degrees Celsius. For example, the capacitors 20 or components associated with the second board portion 14 may have a maximum temperature rating of the upper limit or approximately 85 degrees Celsius. Further, the maximum temperature rating, or operation temperature range of the may depend upon the dielectric material, the conductor material, and the packaging of component (e.g., capacitor), and the construction of the component (e.g., capacitor) in conjunction with the packaging and terminals at a rated voltage and/or current.

In one embodiment, the electronic assembly 11 may comprise an inverter that converts direct current energy into alternating current, such as pulse width modulation to control an electric machine or motor. Similarly, the electronic assembly 11 may comprise a converter that converts a first voltage level of direct current into a second voltage level of direct current, with or without isolation between the conversion. Some inverters and converters are unidirectional, whereas others provide bi-direction processing of the input signals and output signals.

If silicon carbide semiconductor switches are used in a switching module 16 for an inverter, converter or other electronic assembly 11, the electronic assembly 11 can be configured with thermal compartments or thermally isolated sections to support thermal compatibility of the silicon carbide semiconductor switches with other components with lower temperature ratings than the silicon carbide semiconductor switches. For example, the maximum temperature of silicon carbide semiconductors may equal or exceed approximately 200 degrees Celsius, whereas other electronic components have lower temperature ratings such as U.S. military grade temperature ratings (e.g., approximately 140 degrees Celsius), automotive grade temperature ratings (e.g., approximately 125 degrees Celsius), or commercial temperature ratings (e.g., approximately 85 degrees Celsius).

The electronic assembly 11 is well suited to keep or maintain the non-silicon carbide components within their required, design or maximum operating temperature range by one or more of the following techniques that may be employed separately or cumulatively. Under a first technique, the electronic assembly 11 uses thermal separation from the silicon carbide semiconductor or associated switching modules 16 that may incorporate silicon carbide semiconductors. For cost-optimized components, like film capacitors 20 with 85 degree Celsius maximum temperature ratings, the components or film capacitors 20 are mounted on or associated with different board sections that the silicon carbide components or higher temperature rated components. For example, the capacitors 20 are installed on the second board section 14 that is thermally isolated from silicon carbide semiconductors installed or associated with the first board section 12. In some configurations, the first board portion and its associated components can operate reliably within the higher maximum operating temperature range of commercially available silicon carbide semiconductor devices, whereas the second board section 14 and its associate components operate at lower automotive grade temperatures or lower commercial grade temperatures.

Under a second technique, the electronic assembly 11 uses the circulation of coolant within an engine coolant loop 40 to cool the inverter, converter or electronic assembly 11. For example, in the off-road equipment or vehicles, engine coolant loops 40 can reach in excess of 115 degrees Celsius, which is compatible with adjoining silicon carbide semiconductors or switching modules 16 that incorporate silicon carbide semiconductors or the wide band-gap semiconductor devices.

In some embodiments, the electronic assembly 11 further comprises a third board section, which includes or comprises a driver module 44 for driving the switching module 16. Within the driver module 44, an electronic data processor is configured to generate or transmit data messages or a control signal (e.g., switching pulses) to drive or to apply to the switching module 16 based on sensor data from one or more sensors 606 on the first board section 12.

In certain configurations, an upper housing portion 32 and a lower housing portion 34 surround the second board section; the upper housing portion 32 comprises upper fins 36 for dissipating heat for providing a lower resistance thermal path than the thermal isolation intermediary 26. In some configurations, the first board section 12 is associated with a coolant chamber for circulating coolant in thermal communication with the switching module 16 to provide a lower resistance thermal path than the thermal isolation intermediary 26. For example, the coolant chamber is located adjacent to and beneath the switching module 16.

In one embodiment, the electronic assembly 11 can be divided, structured or organized in to multiple thermal sections including one or more of the following: (1) a first thermal section 601, (2) a second thermal section 602, (3) a third thermal section 603, and (4) a fourth thermal section 604, where each of the thermal sections is thermally isolated from another thermal section by one or more thermal isolation measures, such as the thermal isolation intermediary 26, radiating fins of the enclosure and coolant loop 40 for circulating coolant (e.g., engine coolant) for dissipation to a heat transferring radiator to ambient temperature conditions. In one configuration, the first thermal section 601 comprises a power semiconductor section or a semiconductor switching module 16 (e.g., for an inverter or converter); the second thermal section 602 comprises a capacitor bank section; the third thermal section 603 comprises a controller or driver board section or driver module 614 (e.g., for providing gate, base or control signals to one or more semiconductors of the switching module 16), and the fourth thermal section 604 comprises a power connection (e.g., DC bus connections) and current sensor section 605 (e.g., for providing direct current power to one or more switching modules 16 and for sensing a current output of one or more phases of the inverter or converter functionality associated with the switching module 16).

The first thermal section 601 is associated with the coolant chamber, circuitous coolant channels or another coolant loop 40 for circulating coolant to remove heat from one or more switching modules 16, semiconductor switches within the switching modules 16, or other heat generating semiconductor devices associated with the first thermal section 601. In one embodiment, the coolant loop 40 of the switching module 16, or the inverter, or converter can be found directly beneath a power switching module 16 or a current sensor 606 associated with the alternating current output phases of the power switching module 16.

In some configurations, the power switching modules 16 have direct cooling between the coolant and the base of the power semiconductors. For example, output phase terminals 607 (e.g., bus bars or cables) are designed to interface a cooling plate 609 (e.g., heat sink) directly adjacent to (e.g., in front of) the switching module 16. One or more current sensors 606 may be associated with or electromagnetically coupled to corresponding output terminals (e.g., the phase bus bars). For example, the one or more current sensors 606 may be positioned, aligned or nested in the middle of the phase bus bars. The output phase terminals 607 (e.g., phase bus bars) are terminated with phase connectors 610 at the interface accessible on an exterior of the housing of the electronic assembly 11. The DC bus may also have connectors 611.

In one configuration, the output phase terminals 607 (e.g., phase bus bars) are positioned directly in front of the power switching module 16 to ensure heat dissipation from the power semiconductors of the power switching module 16 does not impact the life of the current sensors 606. Further, the phase connectors are not de-rated because of heat generated from the power semiconductors within the power switching module 16. Finally, heat generated from the phase connectors has limited or mitigated thermal impact on the current sensors 606.

The third thermal section 603 (e.g., third board section 42) comprises the control and gate drive section of the inverter. The third thermal section 603 may be positioned directly above the power switching module 16 or power semiconductors. The design of the third thermal section 603 includes a dielectric carrier 31 (e.g., dielectric support frame and/or connector module comprising a dielectric housing with spring loaded conductive terminals) to support the third thermal section 603 above the first thermal section 601; which provides some ambient air barrier to transfer for thermal energy from the first thermal section 601 (e.g., first board section 12) to the third thermal section 603 (e.g., third board section). Accordingly, the third thermal section 603 supports a driver or controller for controlling the switching module 16, that limits thermal buoyancy flows driving into the third thermal section 603 from other thermal sections or other board sections of the electronic assembly 11.

Figure 1:
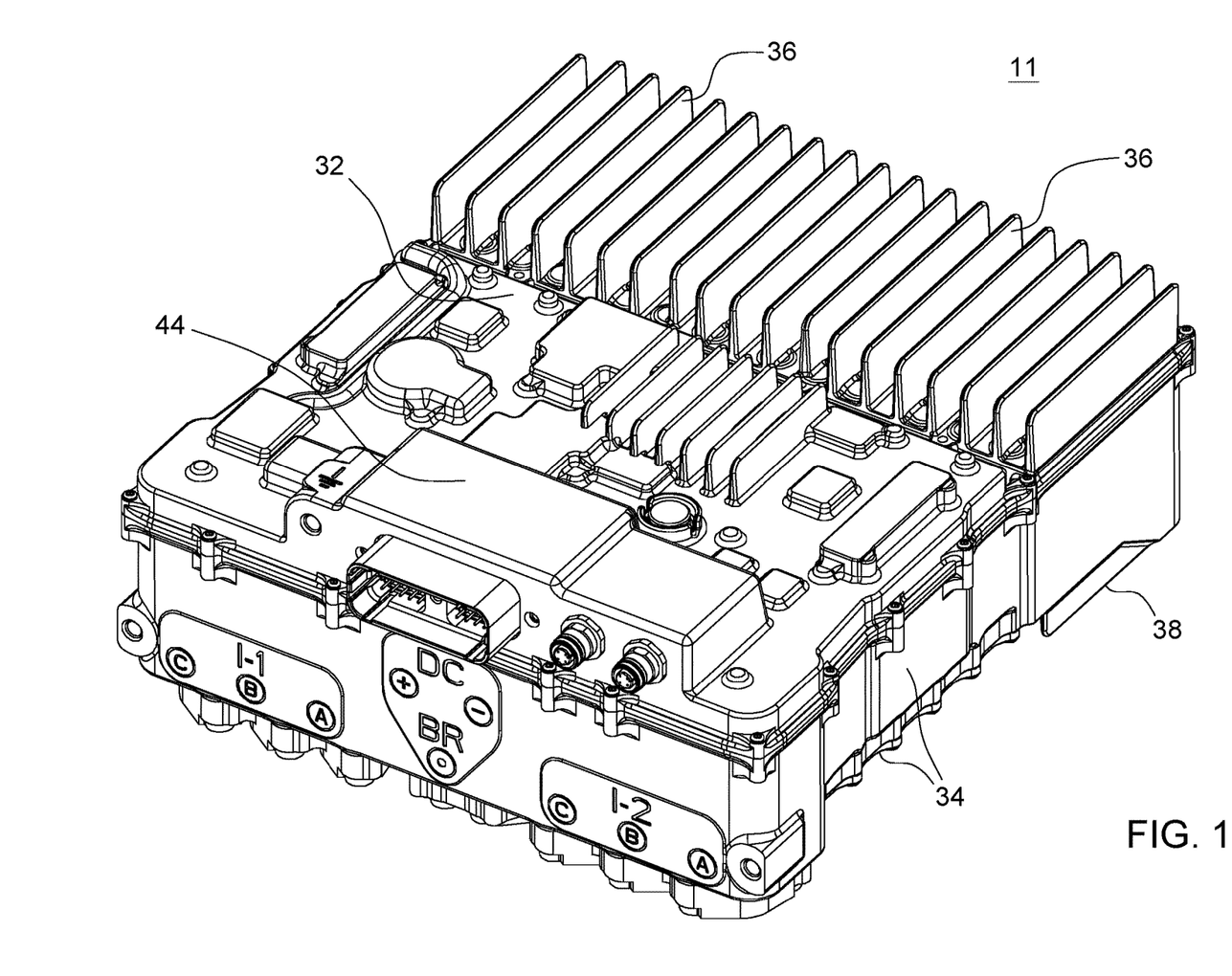
FIG. 1 is an upper perspective view of one embodiment of the outer housing of the electronic assembly that reveals an upper housing portion.
Figure 2:
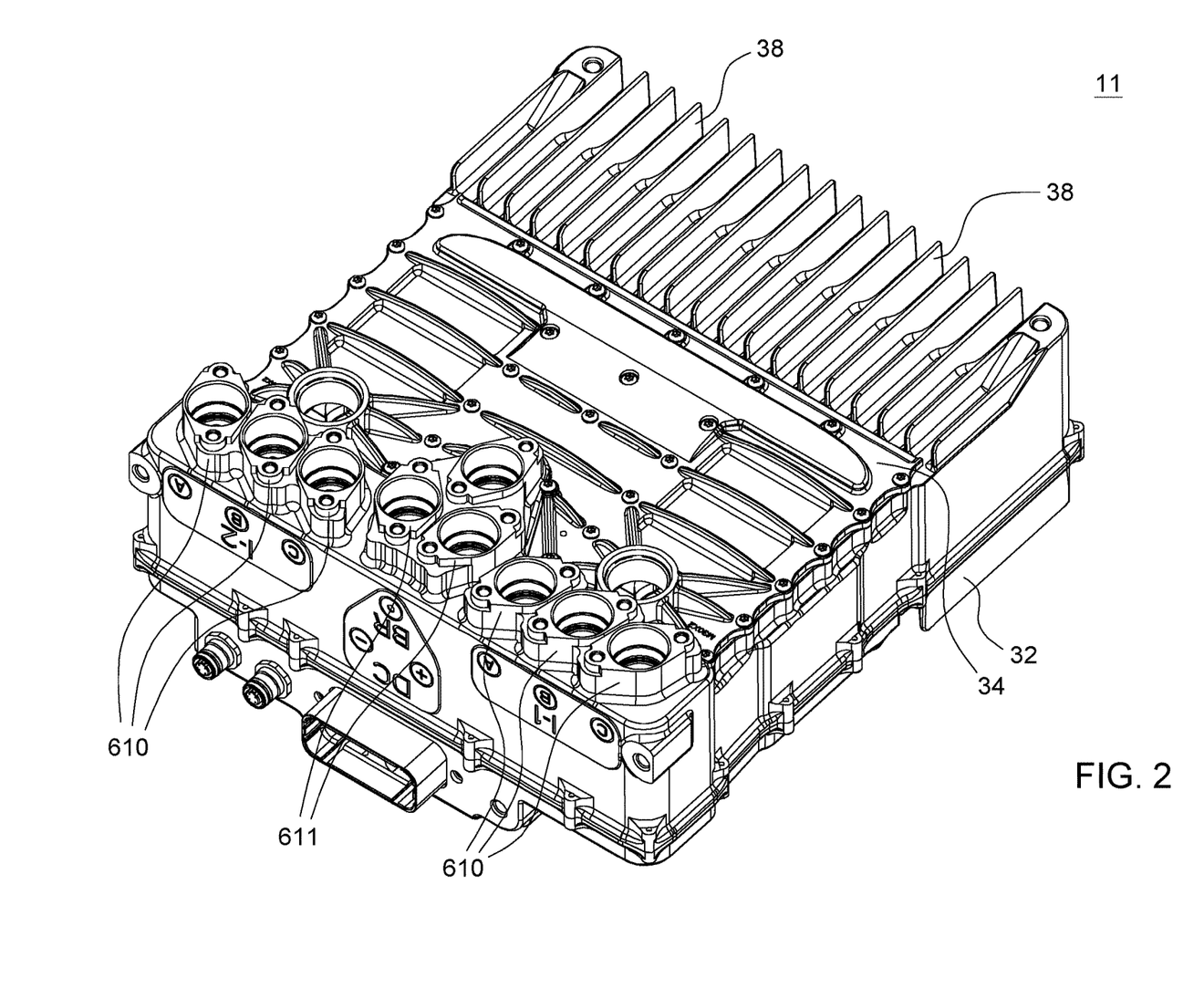
FIG. 2 is a lower perspective view of one embodiment of the outer housing of the electronic assembly that reveals a lower housing portion.
Figure 3:
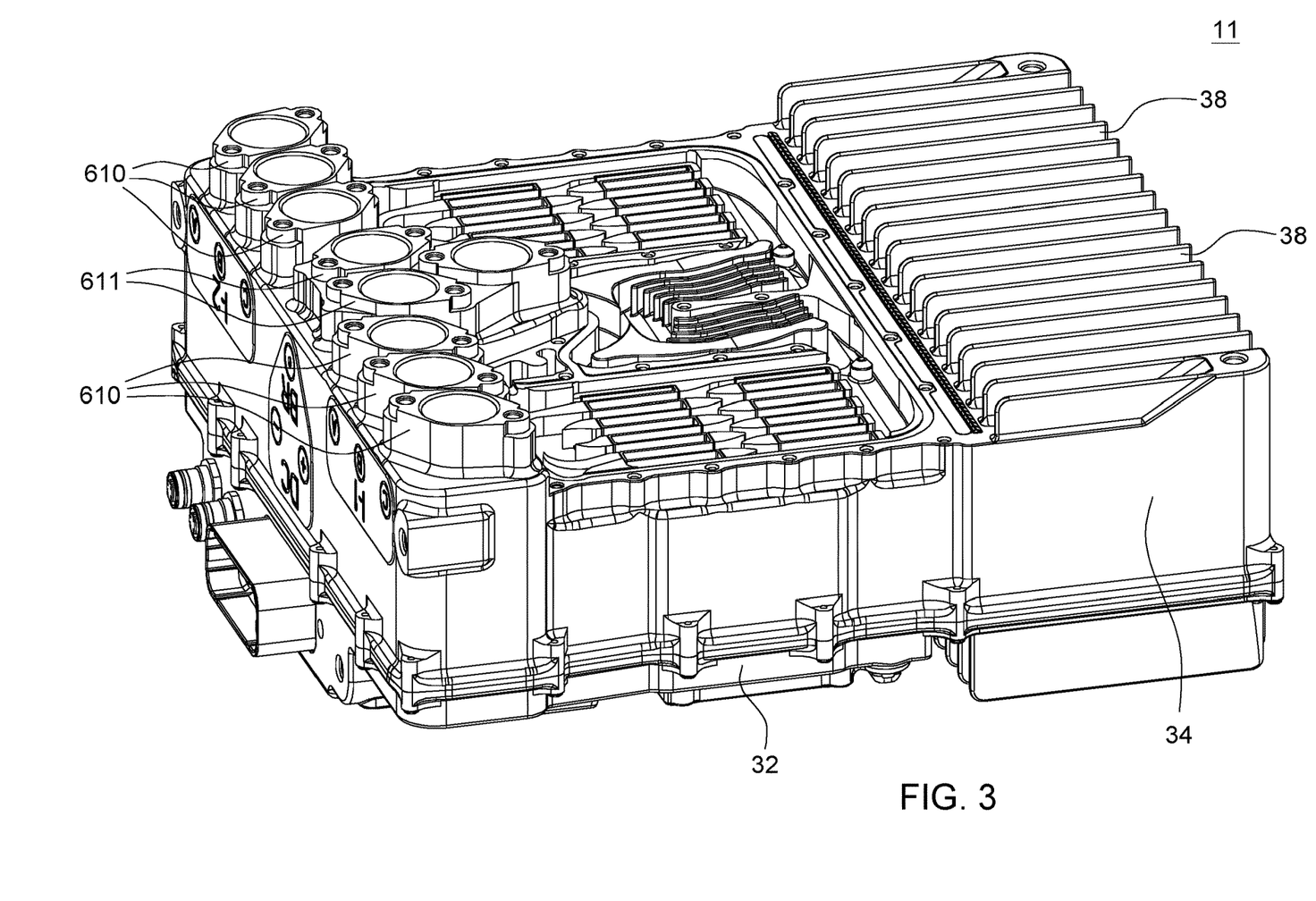
FIG. 3 is a side perspective view of one embodiment of the outer housing of the electronic assembly.
Figure 4:
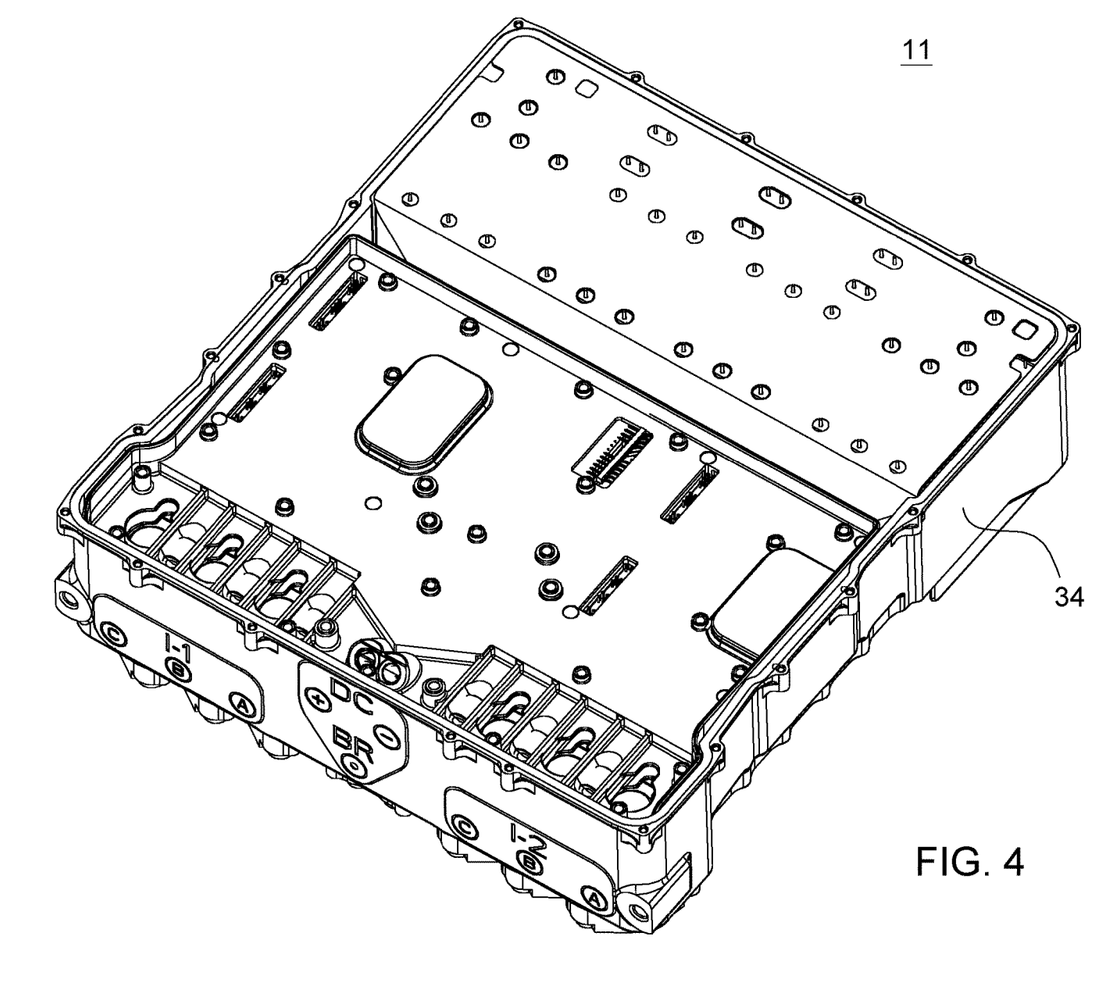
FIG. 4 is an upper perspective view of one embodiment of the outer housing with the upper housing portion removed to reveal an interior (e.g., driver module) of the electronic assembly.
Figure 5:
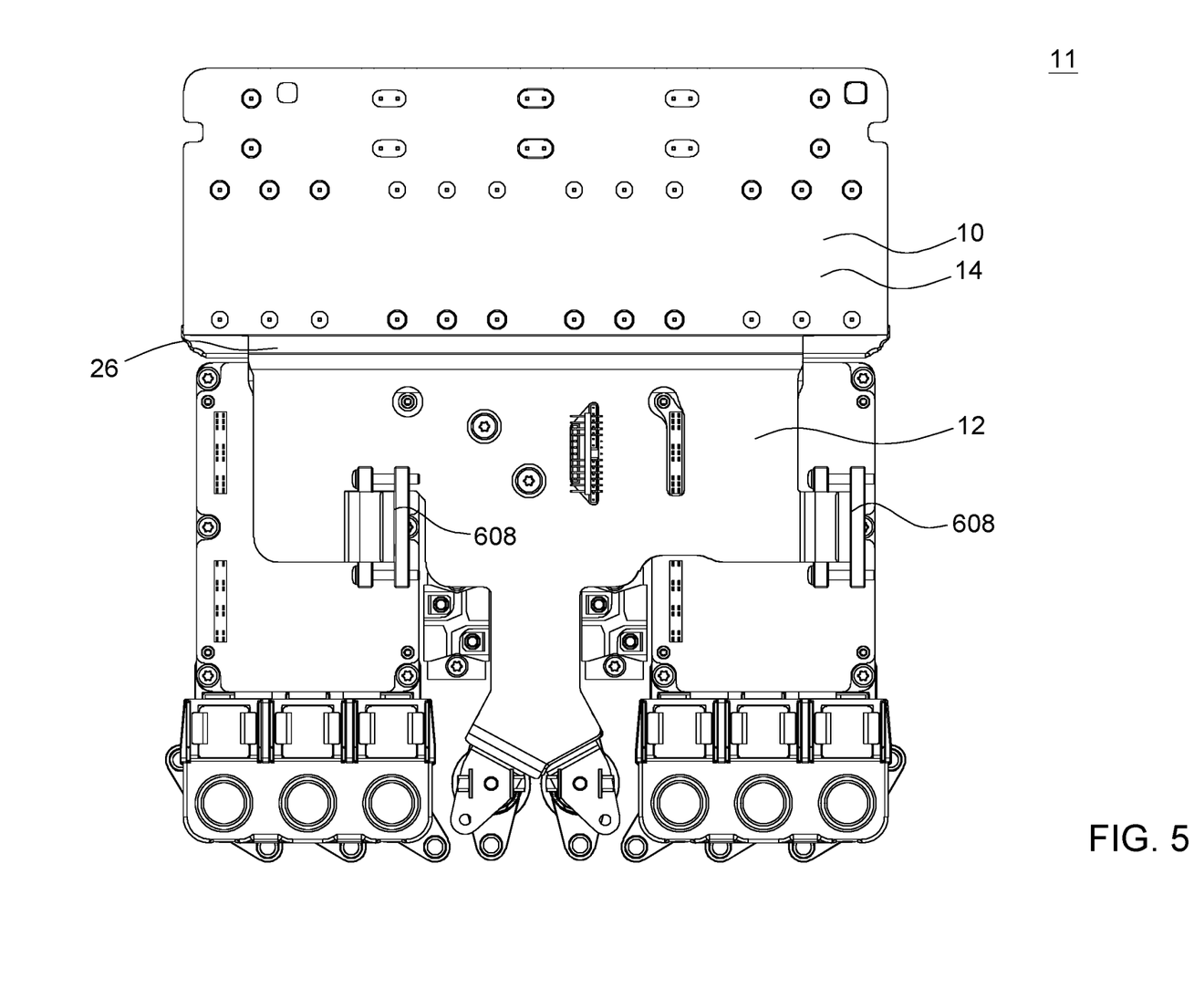
FIG. 5 is an upper view of the one embodiment of the electronic assembly with a driver module removed to reveal a direct current bus and associated switching modules.
Figure 6:
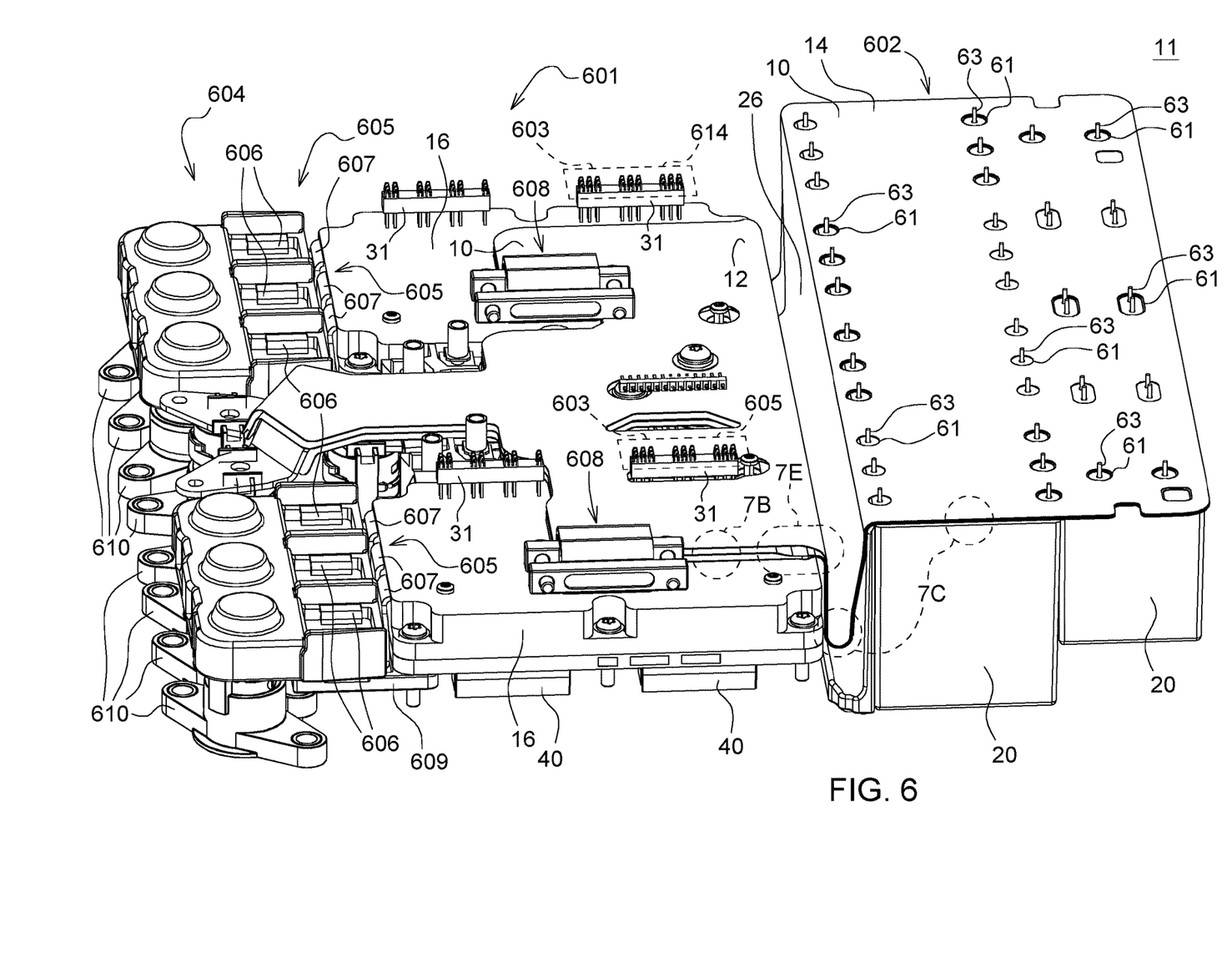
FIG. 6 is an upper and side view of one embodiment of the electronic assembly with a driver module removed to reveal the direct current bus and associated switching module.

As illustrated in FIG. 6, the second thermal section 602 (e.g., second board section 14) is found to the rear of the electronic assembly 11 (e.g., inverter). The second board section 14 or capacitor section of the electronic assembly 11 is configured to optimize heat transfer away from the heat generating capacitors 20 via dielectric thermal interface material and the housing, which has upper and lower fins 38 to transfer heat to the ambient environment. In one embodiment, the electronic assembly 11 supports the use of commercially available, or off the shelf film capacitors 20 with temperature ratings that are common in the high voltage electronics industry. The drawback to these kinds of film caps consists of their ultimate temperature rating; with a maximum hot spot temp of 85 degrees Celsius. Accordingly, the second thermal section 602 is configured with full thermal separation from other sections or parts of the electronic assembly 11 (e.g., inverter or converter).

To support a low resistance thermal path to the ambient environment via the housing of the electronic assembly 11, rather than via the thermal isolation intermediary 26, the housing is configured as follows. The lower housing portion 34 supports thermal separation by facilitating low resistance heat transfer through the housing. The lower housing of the electronic assembly 11 has full thermal break consisting of an air gap (e.g., above and below the thermal isolation intermediary 26) in the case that is filled with a thermally conductive sealant, a thermally conductive potting material, or another dielectric thermal interface material (e.g., injected into or placed within air gap volume 55 in the housing). The lower housing case includes buoyancy air cooling fins to help dissipate heat generated within the capacitors 20.

In one configuration, the lower housing portion 34 is sealed to the upper housing portion 32 with a sealant, elastomer, gasket or seal, to provide environmental sealing that prevents in the ingress of moisture, salt, fog or other contaminants. Further there is a copper/beryllium spring finger strip to ensure electromagnetic sealing of the electronics with the electronic assembly 11.

The upper housing portion 32 (e.g., cover of enclosure) is designed differently from the lower housing portion 34 (e.g., bottom of enclosure). The upper housing portion 32 supports of a thermal path (e.g. torcher path) for heat transfer. This thermal path (e.g., torcher path) has protruding features in the upper housing portion 32 that increase the surface area (e.g., length) of the upper housing portion 32 within a small lineal distance. As illustrated, the upper housing portion 32 has air flow cooling fins to couple the capacitor section or second board section 14 to the external environment separately from the liquid coolant loop 40.

In one embodiment, DC bus connection 608 between the switching module 16 and the DC bus terminal supports a low inductance and high thermal conductivity interconnection that facilitates heat transfer from the switching module 16 via the first board section 12, or its DC bus portion. Dielectric thermal material can be introduced into any air gap between the first board section 12 and the upper housing portion 32 or housing to improve heat transfer to the external environment.

The DC bus connection 611 (in FIG. 7A) between the first board section 12 and the thermal isolation intermediary 26 within the electronic assembly 11 serves multiple purposes, as does the DC bus connection 613 between the thermal isolation intermediary and the second board section 14 First, the DC bus connection 611 or the thermal isolation intermediary 26 enhances or increase an effective surface length of the upper housing portion 32 without compromising environmental or electromagnetic interference (EMI) sealing needs. This increase in surface area or exposed surface length helps to limit heat transfer coupled from the front portion of the electronic assembly 11 to the rear portion of the electronic assembly 11.

Second, the DC bus connection 611 or the thermal isolation intermediary 26 supports or is consistent with the interface of one or more thin conductive layers (27, 33) of a primary thickness 24, a secondary thickness 124, or both of the DC bus on the thermal isolation intermediary 26 with enhanced surface area contact. For example, the DC bus connection is coupled to the thin conductive layer of primary thickness 24 of the DC bus with a thermal interface compound and conducts heat to the upper housing portion 32 and its attendant cooling structure. The heat transfer from the thermal isolation intermediary 26 or the thin part of the DC bus to the upper housing portion 32 significantly limits the heat from one or more power switching modules 16 that might have otherwise been conducted or directed into the capacitors 20.

Figures 7B, 7C, 7D:
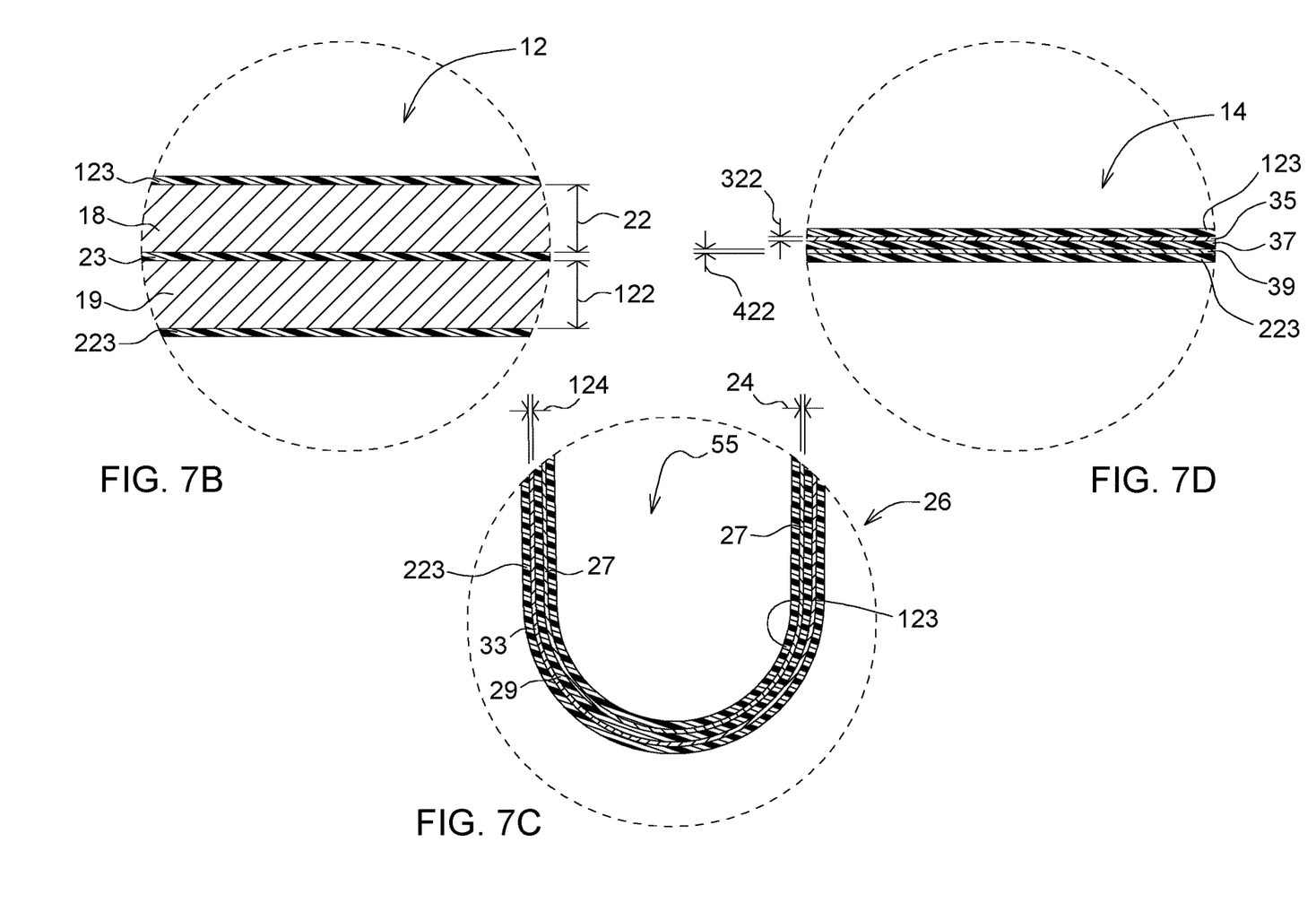
FIG. 7B illustrates an enlarged circular region 7B of FIG. 7A.
FIG. 7C illustrates an enlarged circular region 7C of FIG. 7A.
FIG. 7D illustrates an enlarged circular region 7D of FIG. 7A.

In the electronic assembly 11 (e.g., inverter), the DC bus assembly of the first thermal section 601 can be divided into two sections: (1) a forward section and a (2) rear section. In one embodiment, the forward section or first board section 12 features conductive layers (18 and 19, as illustrated in FIG. 7B), such as thick bus plates, that connect to the power switching modules 16 to provide DC power to the power switching modules 16. For example, the first conductive layer 18 and the second conductive layer 19 may have a first thickness 22 and a second thickness 122, respectively, as illustrated in FIG. 7B. In one example, the first thickness 22 and the second thickness 122 each may comprise approximately 2 millimeter (or greater) thick copper, such as copper plating or copper alloy plating, for each conductor of the DC bus. Further, other suitable thicknesses can be used for the first thickness 22, the second thickness 122 and the third thickness 222 one or more of the conductive layers (18, 19), respectively, such as thicknesses that are minus twenty-five percent of approximately 2.0 millimeters thick or greater thickness.

The first thickness 22 and the second thickness 122 of the conductive layers (18, 19), or thick DC bus plates, facilitate high current to be conducted or transferred between the two power switching modules 16 and to one or more DC bus connections (e.g., connection points). The DC bus may be coupled (e.g., electrically or electromagnetically) to other modules, such as a brake chopper assembly. The conductive layers (18, 19) are separated by an intermediate dielectric layer 23 to form a multi-layered direct current bus structure or a multi-layered circuit board structure.

In an alternate embodiment, any of the conductive layers (18, 19) may have portions or segments that comprise conductive traces, pads, ground planes, microstrip, stripline, conductive through-holes, conductive vias or other features to support the formation of proper circuits among the electronic or electrical components that populate the circuit board (e.g., first board section 12).

In one embodiment, as illustrated in FIG. 7B, the first conductive layer 18 and the second conductive layer 19 are separated an intermediate dielectric layer 23 that electrically isolates the first conductive layer 18 from the second conductive layer 19. Exterior dielectric layers (123, 223) or outer dielectric films overlie the first conductive layer 18 and the second conductive layer 19. For example, the first exterior dielectric layer 123 overlies a corresponding first conductive layer 18; the second exterior dielectric layer 223 overlies a corresponding second conductive layer 19.

The first conductive layer 18 has a corresponding first thickness 22; the second conductive layer has a corresponding second thickness 122. In one configuration the first thickness 22 and the second thickness 122 are greater than or equal to 2 millimeters. The first conductive layer 18 and the second conductive layer 19 may be composed of copper, a copper alloy, aluminum, an aluminum alloy, or other metal or metal alloy, for example. Any of the electric bus structures, such as the first conductive layer 18, the second conductive layer 10, the primary conductive layer 27, the secondary conductive layer 33, the first metallic layer 35 and the second metallic layer 39, may be composed of type 1350 aluminum, 8000 series aluminum for conductors with generally elliptical or circular cross sections, or 6101 aluminum.

Figure 7E:
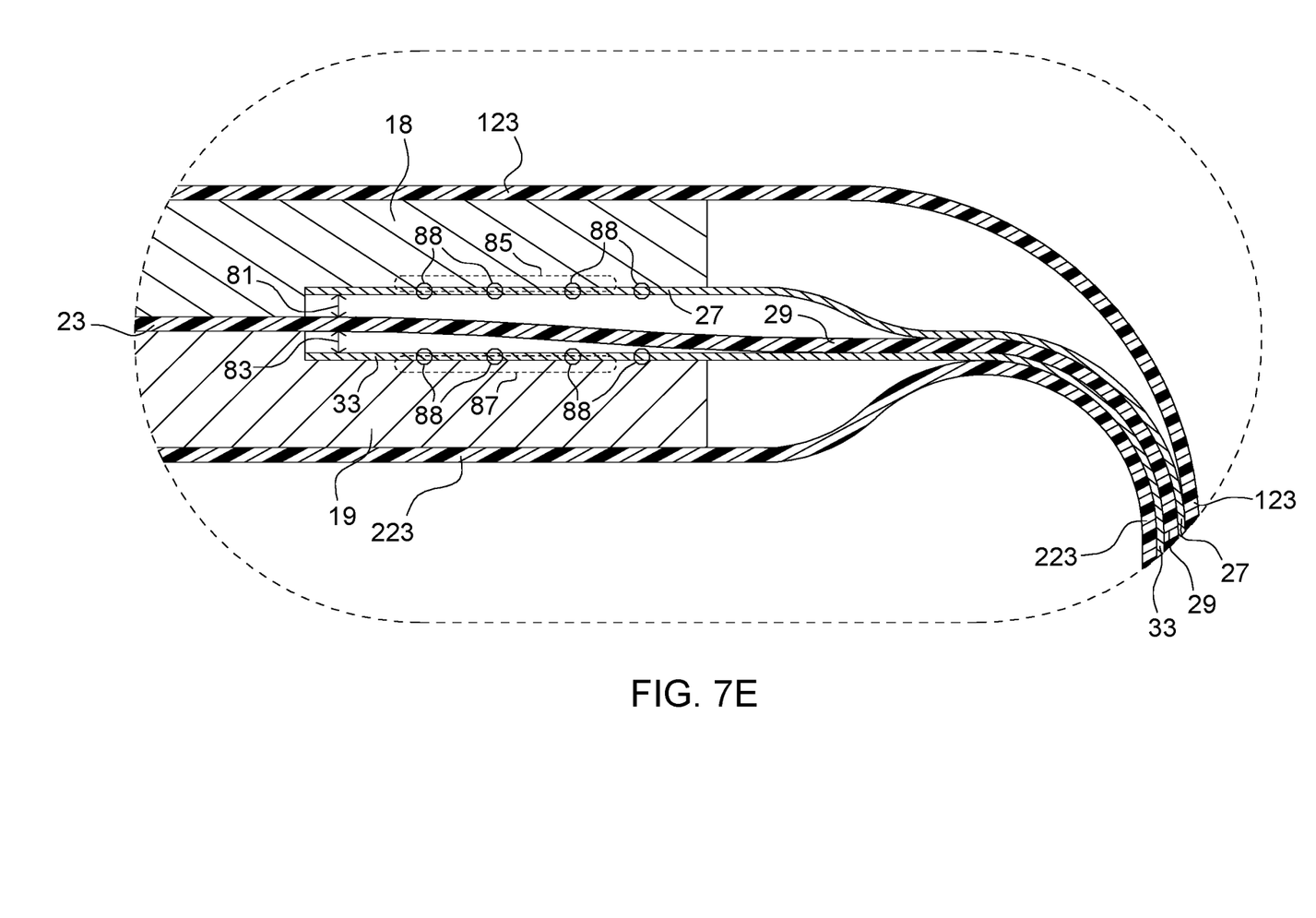
FIG. 7E illustrates an enlarged circular region 7E of FIG. 7A

In FIG. 7E at the interface 28 between the first board section 12 and the thermal isolation intermediary 26, a back edge of each DC bus conductor (e.g., first conductive layer 18 and second conductive layer 19) adjoins a corresponding primary conductive layer 27 or a secondary conductive layer 33. For example, the first conductive layer 18 is electrically and mechanically connected to the primary conductive layer 27; the second conductive layer is electrically and mechanically connected to the secondary conductive layer 33.

As illustrated in FIG. 7C in the thermal isolation intermediary 26, the primary conductive layer 27 and the secondary conductive layer 33 overlie an intermediate dielectric layer 29, such as an inner flexible dielectric layer (e.g., polyimide layer), to form a flexible direct current (DC) bus assembly, or a double-sided flexible circuit board. In one embodiment of the thermal isolation intermediary 26, the exterior portions of the flexible DC bus assembly or the flexible circuit board, such as the primary conductive layer 27 and the secondary conductive layer 33 may be electrically isolated by an exterior dielectric sheathing, dielectric film, exterior coating, or exterior dielectric layer (123, 223).

Further, in some embodiments, the thermal isolation intermediary 26 is folded to increase the length (e.g., in comparison to a direct linear path of conductors between the first board section 12 and the second board section 14) of the conductive path of the primary conductive layer 27 and the secondary conductive layer 33 (of the generally flexible DC bus) between the first board section 12 and the second board section. Accordingly, the increased length of the conductive path of the primary conductive layer 27 and the secondary conductive layer 33 increases thermal resistance of the primary conductive layer 27 and the secondary conductive layer 33, and the thermal resistance or thermal barrier between the first board section 12 and the second board section 14. Meanwhile, the folded thermal isolation intermediary 26 may be coupled thermally to the housing via thermally conductive dielectric material (e.g., injected into or placed within the air gap volume 55 of the housing) to transfer heat from the thermal isolation intermediary to an exterior of the housing to the ambient environment.

In one embodiment, although the primary conductive layer 27 and the secondary conductive layer 33 may have other suitable thicknesses of metal or a metal alloy, the primary conductive layer 27 and the secondary conductive layer 33 each have a thickness (e.g., metallic film thickness) of approximately 0.127 millimeters, approximately five mils or approximately five thousandths of an inch, with a tolerance of plus or minus twenty-five percent. The primary conductive layer 27 and the second conductive layer may be composed of copper, a copper alloy, an elastically deformable copper alloy, an elastically deformable copper film, aluminum, an aluminum alloy, an elastically deformable aluminum alloy, an elastically deformable aluminum film, or the like.

The primary conductive layer 27 is electrically connected and mechanically connected to the first conductive layer 18. The secondary conductive layer 33 is electrically connected and mechanically connected to the second conductive layer 19. As illustrated in FIG. 7E, in one embodiment the first conductive layer 18 has a first recess 81 for receiving an end of the primary conductive layer 27 and bonding, brazing, welding or soldering the end or end portion of the primary conductive layer 27 to the corresponding first recess 81 of the first conductive layer 18 to form an electrical and mechanical connection. In one configuration, the first recess 81 comprises a notch, slot, groove, or upper channel in a lower surface of the first conductive layer 18. For example, the primary conductive layer 27 is welded, bonded or fused, at one or more discrete locations or in a one or two dimensional (first) array of spot welds to the end portion or first recess 81 of the first conductive layer 18. The first array of spot welds, solder points, bonding or fusion points, which are indicated by the oval regions 88, may be located in the interface region 85 of the first recess 81.

As illustrated in FIG. 7E, in one embodiment the second conductive layer 19 has a second recess 83 for receiving an end of the secondary conductive layer 33 and bonding, brazing, welding or soldering the end or end portion of the secondary conductive layer 33 to the corresponding recess 83 of the second conductive layer 19 to form an electrical and mechanical connection. In one configuration, the second recess 83 comprises a notch, slot, groove, or lower channel in an upper surface of the second conductive layer 19. For example, the end portion of the secondary conductive layer 33 is welded at one or more discrete locations or in a one or two dimensional (second) array of spot welds, to the end portion or second recess 83 of the second conductive layer 19. The second array of spot welds, solder points, bonding or fusion points, which are indicated by the oval regions 88, may be located in the region 87 of the second recess 83.

The primary conductive layer 27 and the secondary conductive layer 33 are separated and electrically isolated from each other by an intermediate dielectric layer 29. The exterior dielectric layer 123 overlies the primary conductive layer 27, whereas the exterior dielectric layer 223 overlies the secondary conductive layer 33. As illustrated, the primary conductive layer 27 and the secondary conductive layer 33 each comprise a flexible (e.g., generally elastically deformable within limits of metal properties) thin sheet of metal or metal alloy (e.g., copper, copper alloy, aluminum or aluminum alloy) of the thermal isolation intermediary 26. The primary conductive layer 27 has a primary thickness 24 and the secondary conductive layer 33 has a secondary thickness 124. For example, in one configuration, the primary thickness 24 is approximately 0.127 millimeters thick and the secondary thickness 124 is approximately 0.127 millimeters thick, although other suitable thicknesses can be used for the primary thickness 24 and the secondary thickness 124 of the primary conductive layer 27 and the secondary conductive layer 33, respectively, such as thicknesses that are plus or minus twenty-five percent of approximately 0.127 millimeters thick.

The thin sheet of metal or metal alloy (e.g., copper, copper alloy, aluminum or aluminum alloy) of the thermal isolation intermediary 26 is joined to the thick section of the DC bus conductor (18, 19), at the fourth thermal section, or first board section 12 by soldering, resistance welding, fusion, bonding, laser welding, or other highly electrically conductive method at an interface region 85. The interface region 85 comprises an interface area or overlapping interface area between a first pair of conductive layers (18, 27). Similarly, the interface region 87 provides an interface area or overlapping interface area between a second pair of conductive layers (19,33). The thin sheets of metal or metal alloy (e.g., copper, copper alloy, aluminum or aluminum alloy) allow the DC bus to extend to the capacitors 20 without the need to carry additional metal or metal alloy (e.g., copper) into the assembly that might otherwise increase weight of the electronic assembly 11 and cost of the electronic assembly 11. In one embodiment, the thin sheets of metal or metal alloy (e.g., copper) of the thermal isolation intermediary 26 are sized for the root-mean-squared (RMS) capacitor ripple current alone at one or more DC buses. The construction of the DC bus is such that the insulation between and surrounding the conduction layers is kept unbroken through the length of the DC bus comprising the first board section 12, the second board section 14 and the thermal isolation intermediary 26. At the interface 28 of the thermal isolation intermediary 26, which is between the thicker DC bus portion (e.g., first board section 12) and the end or rear section of the thin conductive layer or flexible DC bus section defined by the thermal isolation intermediary 26.

In FIG. 7D in one embodiment, the second board section 14 comprises a DC bus section with a first metallic layer 35 and a second metallic layer 39 separated by an intermediate dielectric layer 37. For example, the second board section 14 comprises a continuation of conductive members (27,33) of flexible DC bus section of the thermal isolation intermediary 26 as metallic layers (35,39) (e.g. metallic members) in the second board section 14. Exterior dielectric layers (123, 223), such as outer dielectric sheathing or protective dielectric films, overlie the first metallic layer 35 and the second metallic layer 39. Capacitor connections, such as capacitor leads 63 soldered to conductive through-holes in the second board section 14 are near a rear of the electronic assembly 11; allow film cap leads to be soldered, resistance welded, or laser welded to the thin section of the DC bus assembly.

In FIG. 7D in the second board section 14, the first metallic layer 35 has a corresponding first thickness 322; the second conductive layer 422 has a corresponding second thickness 422. As illustrated in FIG. 7D and FIG. 7E collectively, the first thickness 322 of the first metallic layer 35 is commensurate with the primary thickness 24 of the primary conductive layer 27; the second thickness 422 of the second metallic layer 39 is commensurate with the secondary thickness 124 of the secondary conductive layer 33; particularly where the first metallic layer 35 is a continuous extension of the primary conductive layer 27 and where the second metallic layer 39 is a continuous extension of the secondary conductive layer 33. Although other conductor thicknesses are possible and fall within the scope of disclosure, in some configurations the primary thickness 24, the secondary thickness 124, the first thickness 322 and the second thickness 422 are approximately 0.127 millimeters thick plus or minus twenty-five percent. Further, the first metallic layer 35 may be substantially continuous (e.g., seamless or jointless extension) with the primary conductive layer 27; the second metallic layer 39 may be continuous (e.g., seamless or jointless extension) with the secondary conductive layer 33.

However, in alternate embodiments the first metallic layer 35 has a corresponding first thickness 322 that is greater than the primary thickness 24 of the primary conductive layer 27; the second metallic layer 39 has a corresponding second thickness 422 that is greater than the secondary thickness 124 of the secondary conductive layer 33. Further, the first metallic layer 35 may be welded, fused, bonded, brazed or soldered to the primary conductive layer 27; the second conductive metallic layer 39 may be welded, fused, bonded, brazed or soldered to the secondary conductive layer 33, such as, consistent with, or similar to the electrical and mechanical connections of FIG. 7E between the conductive layers (18, 19, 27, 33). In one embodiment, select areas of the thin section of the DC bus at the primary conductive layer 27, the secondary conductive layer 33 or both, are left exposed such that free wires maybe joined, bonded, soldered or welded to the bus to support other components, such as capacitors 20 or devices to reduce electromagnetic interference (EMI).

In one embodiment, the thermal isolation intermediary 26 comprises a thin section or thin portion of a DC bus for the electronic assembly 11. First, the thermal isolation intermediary 26 supports efficient manufacturing because the back end of the DC bus assembly is flexible. For example, by supporting flexibility, the DC bus is able to be folded in the housing interior of the electronic assembly 11 and be shaped by the housing or other components. Second, with respect to heat transfer; the thermal isolation intermediary 26 has a thin bus section of the DC bus that allows the DC bus to be folded; hence, with the DC bus can be extended by some lineal length within a given interior dimension or limited volume of the housing interior. The extended length of the DC bus, in the thin condition, increases the thermal path (e.g., torcher path) to reduce the efficiency of heat transfer between the first board section 12 and the second board section 14. The extended length significantly reduces the amount of heat the bus can carry from the power switching module 16 to the capacitors 20 of the second board section 14; facilitates increased surface area for heat dissipation. Accordingly, the increased surface area can then be coupled to the enclosure through the use of matching/forming geometry and a dielectric thermal interface 28 material. The thermal isolation intermediary 26 comprises an extended length that is folded within the housing to increase the thermal resistance between the first board section 12 and the second board section 14.

In one configuration, to ensure heat generated within the capacitors 20 is dissipated, the top side of the thermal isolation intermediary 26, or the thin DC bus, in the bulk capacitor region, and the bottom side of the capacitors 20 are thermally coupled to the case components with the use of a dielectric thermal interface material. The thermal isolation intermediary 26 comprises an extended length that is folded within the housing and encapsulated or contacted with a dielectric thermal interface material to fill an air gap volume 55 between the thermal isolation intermediary 26 and a housing interior.

In FIG. 7D in the second board section 14, a circuit board comprises a first metallic layer 35 and a second metallic layer 39 that overlie an intermediate dielectric layer 37 or dielectric core, where the first metallic layer 35, the second metallic layer 39 are arranged to form conductive traces, conductive pads, metallic plated through-holes, metallic vias and other circuit board features for formation of interconnections, circuits or networks between and among electronic component, such as capacitors 20. For example, in the second board section 14 the first metallic layer 35, the second metallic layer 39 may have a first thickness 322 and a second thickness 422, respectively, as illustrated in FIG.

7D. In one embodiment, the first thickness 322 and the second thickness 422 each may comprise approximately 0.127 millimeters thick copper (e.g., plus or minus twenty-five percent), such as copper plating or copper alloy plating, for each conductor of the DC bus.

In one example of an alternate embodiment, the first thickness 322 and the second thickness 422 each may comprise approximately 2 millimeter (or greater) thick copper, such as copper plating or copper alloy plating, for each conductor of the DC bus. Further, in an alternate embodiment, other suitable thicknesses can be used for the first thickness 322 and the second thickness 422 and one or more of the conductive metallic layers (35, 39), respectively, such as thicknesses that are minus twenty-five percent of approximately 2.0 millimeters thick or greater thickness.

The electronic assembly 11 is well suited for supporting thermal isolation between higher temperature components and lower temperature components by thermal isolation intermediary 26, such as a thin flexible direct current (DC) bus structure that provides efficient (e.g., low inductance) coupling to a bank of film capacitors 20 and thermal isolation of the capacitors 20. Further, the electronic assembly 11 supports a layout of a converter or inverter using silicon carbide semiconductor or other wide band-gap power semiconductors in conjunction with engine coolant to cool the power semiconductors (e.g., without degrading materially heat dissipation of surrounding non-semiconductor components). In some embodiments, the thermal features of the electronic assembly 11 support a capacitors 20 or the second board section 14 that follows or tracks the external ambient conditions; generally, fully decouples the capacitors 20, or second board section 14, from the cooling fluid or one or more power switching modules 16.

While the disclosure has been illustrated and described in detail in the drawings and foregoing description, such illustration and description is to be considered as exemplary and not restrictive in character, it being understood that illustrative embodiments have been shown and described and that all changes and modifications that come within the spirit of the disclosure are desired to be protected. It will be noted that alternative embodiments of the present disclosure may not include all of the features described yet still benefit from at least some of the advantages of such features. Those of ordinary skill in the art may readily devise their own implementations that incorporate one or more of the features of the present disclosure and fall within the spirit and scope of the present invention as defined by the appended claims.

The following is claimed:

1. An electronic assembly comprising:
   a circuit board comprising a first board section and a second board section;
   the first board section comprising a switching module with heat-generating semiconductor switches associated with a first operational temperature range, the first board section having a first conductive layer of a first thickness;
   the second board section comprising a plurality of capacitors mounted on the second board section, the second board section having a first metallic layer that comprises conductive traces for interconnecting the capacitors as a network, the capacitors associated with a second operational temperature range that is lower than the first operational temperature range; and
   a thermal isolation intermediary between the first board section and the second board section, where the first board section and the second board section are spaced apart from each other by the thermal isolation intermediary, wherein the thermal isolation intermediary has a thin conductive layer, that is thinner than the first thickness, to prevent heat transfer from the first board section and their heat-generating semiconductor switches to the second board section.

2. The electronic assembly according to claim 1 wherein the thermal isolation intermediary comprises a flexible thermal isolation valley.

3. The electronic assembly according to claim 1 wherein the thin conductive layer is welded, fused or soldered to the first conductive layer at an interface or at an overlapping interface area.

4. The electronic assembly according to claim 1 wherein the thermal isolation intermediary comprises a flexible thermal isolation valley that has a lower portion that is lower than the first board section and the second board section to prevent heat transfer from the first board section to the second board section.

5. The electronic assembly according to claim 1 wherein the first operational temperature range has an upper temperature limit of approximately 125 degrees Celsius.

6. The electronic assembly according to claim 1 wherein the second operational temperature range has an upper temperature limit of approximately 85 degrees Celsius.

7. The electronic assembly according to claim 1 wherein an upper housing portion and a lower housing portion surround the second board section; and wherein the upper housing portion comprises upper fins for dissipating heat for providing a lower resistance thermal path than the thermal isolation intermediary.

8. The electronic assembly according to claim 1 wherein the first board section is associated with a coolant chamber for circulating coolant in thermal communication with the switching module to provide a lower resistance thermal path than the thermal isolation intermediary.

9. The electronic assembly according to claim 8 wherein the coolant chamber is located adjacent to and beneath the switching module.

10. The electronic assembly according to claim 1 wherein the thermal isolation intermediary has embedded conductors or conductive traces to communicate electrical energy between the switching module and the capacitors to filter current ripple in a direct current (DC) bus that supplies the switching module with electrical energy.

11. The electronic assembly according to claim 1 further comprising:
    a third board section comprising:
    a driver module for driving the switching module;
    an electronic data processor for generating or transmitting data messages or a control signal to drive or to apply to the switching module based on sensor data from one or more sensors on the first board section.

12. The electronic assembly according to claim 1 wherein the thermal isolation intermediary comprises a flexible circuit board composed of a polyimide dielectric layer and at least one copper layer overlying the polyimide dielectric layer.

13. The electronic assembly according to claim 1 wherein the thermal isolation intermediary comprises an extended length that is folded within a housing to increase the thermal resistance between the first board section and the second board section.

14. The electronic assembly according to claim 1 wherein the thermal isolation intermediary comprises an extended length that is folded within a housing and encapsulated or contacted with a dielectric thermal interface material to fill an air gap between the thermal isolation intermediary and a housing interior.

15. An electronic assembly comprising:
   a circuit board comprising a first board section and a second board section;
   the first board section comprising a switching module with heat-generating semiconductor switches associated with a first operational temperature range, the first board section having a first conductive layer and a second conductive layer that are separated from each other by an intermediate dielectric layer;
   the second board section comprising a plurality of capacitors mounted on the second board section, the second board section having a first metallic layer and a second metallic layer that are separated from each other by the intermediate dielectric layer; the first metallic layer and the second metallic layer comprising conductive traces for interconnecting the capacitors as a network, the capacitors associated with a second operational temperature range that is lower than the first operational temperature range; and
   a thermal isolation intermediary between the first board section and the second board section, where the first board section and the second board section are spaced apart from each other by the thermal isolation intermediary, the thermal isolation intermediary comprises a flexible thermal isolation direct current bus comprising a primary conductive layer and a secondary conductive layer separated by the intermediate dielectric layer; a plurality of exterior dielectric layers overlying the primary conductive layer and the secondary conductive layer, wherein the thermal isolation intermediary is folded to increase the thermal resistance and thermal isolation between the first board section and the second board section.

16. The electronic assembly according to claim 15 wherein the second board section comprises a continuous extension of the thermal isolation intermediary; where the first metallic layer comprises a continuous extension of the primary conductive layer and the second metallic layer comprises a continuous extension of the secondary conductive layer.

17. The electronic assembly according to claim 15 further comprising:
   a first recess in the first conductive layer for receiving an end of the primary conductive layer that is bonded, brazed, welded or soldered the end or end portion of the primary conductive layer to form an electrical and mechanical connection between the first conductive layer and the primary conductive layer; and
   a second recess in the second conductive layer for receiving an end of the secondary conductive layer that is bonded, brazed, welded or soldered the end or end portion of the secondary conductive layer to form an electrical and mechanical connection between the second conductive layer and the secondary conductive layer.

18. The electronic assembly according to claim 17 wherein the first conductive layer is electrically and mechanically connected to the primary conductive layer in a first array of spot welds or fusion points; wherein the second conductive layer is electrically and mechanically connected to the secondary conductive layer in a second array of spot welds or fusion points.

* * * * *